US008173346B2

(12) United States Patent
Harwood, Jr. et al.

(10) Patent No.: US 8,173,346 B2
(45) Date of Patent: May 8, 2012

(54) PRINTING MEMBERS HAVING PERMEABILITY-TRANSITION LAYERS AND RELATED METHODS

(75) Inventors: Gerald P. Harwood, Jr., Billerica, MA (US); Eugene L. Langlais, Amherst, NH (US)

(73) Assignee: Presstek, Inc., Hudson, NH (US)

( * ) Notice: Subject to any disclaimer, the term of this patent is extended or adjusted under 35 U.S.C. 154(b) by 453 days.

(21) Appl. No.: 12/466,760

(22) Filed: May 15, 2009

(65) Prior Publication Data

US 2009/0297983 A1 Dec. 3, 2009

Related U.S. Application Data

(60) Provisional application No. 61/056,504, filed on May 28, 2008.

(51) Int. Cl.
*G03F 7/037* (2006.01)
*G03F 7/26* (2006.01)

(52) U.S. Cl. ..................... 430/138; 430/270.1; 430/302; 101/465; 101/453

(58) Field of Classification Search ........................ None
See application file for complete search history.

(56) References Cited

U.S. PATENT DOCUMENTS 4,371,602 A * 2/1983 Iwasaki et al. ................ 430/175
5,165,343 A * 11/1992 Inoue et al. ................... 101/395
2004/0175652 A1 9/2004 Sanada et al.

FOREIGN PATENT DOCUMENTS

EP 0787583 b1 8/1997
EP 1291172 b1 3/2003
EP 1514696 b1 3/2005
EP 1698481 b1 9/2006
WO WO-2007060200 A1 5/2007

OTHER PUBLICATIONS

International Preliminary Report on Patentability issued on Dec. 9, 2010 for International Application No. PCT/US2009/04459, 6, 6 pages.
International Search Report and Written Opinion, dated Sep. 7, 2009, for International Application No. PCT/US2009/044596.

* cited by examiner

*Primary Examiner* — Cynthia Hamilton
(74) *Attorney, Agent, or Firm* — Bingham McCutchen LLP

(57) ABSTRACT

Affinity transitions from hydrophobic to hydrophilic states, rather than ablation mechanisms, facilitate the creation of an imagewise lithographic pattern on a printing plate. In various embodiments, a lithographic printing member comprises a topmost "imaging" layer that undergoes, in response to heat, a transition from a hydrophobic and oleophilic state to a hydrophilic state (which may or may not also be oleophilic); and a substrate disposed below the imaging layer. The affinity change in the imaging layer may be due essentially to a foaming agent therein. The foaming agent decomposes upon heating, creating a gas that foams the surface of the imaging layer. The resulting spongelike texture enables the surface to retain water, i.e., renders it hydrophilic.

26 Claims, 2 Drawing Sheets

PRINTING MEMBERS HAVING PERMEABILITY-TRANSITION LAYERS AND RELATED METHODS

CROSS-REFERENCE TO RELATED APPLICATION

This application claims priority to and the benefit of U.S. Provisional Patent Application No. 61/056,504, filed May 28, 2008, which is hereby incorporated herein by reference in its entirety.

FIELD OF THE INVENTION

In various embodiments, the invention relates to lithographic printing members and systems and methods for imaging same, and, more particularly, to imaging members with a heat-induced change in hydrophilicity.

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Current laser-based lithographic systems generally rely on removal of an energy-absorbing layer from the lithographic plate to create an image. Exposure to laser radiation may, for example, cause ablation—i.e., catastrophic overheating—of the ablated layer in order to facilitate its removal. Removal of a layer having one affinity (e.g., a hydrophilic layer) reveals an underlying layer having the opposite affinity (e.g., an oleophilic layer). Accordingly, the laser pulse must transfer substantial energy to the absorbing layer. Ablation-type plates may also require a debris-removal step prior to printing.

As a result, there is a need for printing members imageable by mechanisms other than ablation in order to avoid the need for high imaging power and debris removal.

SUMMARY

The present invention utilizes a change in lithographic affinity—in particular, from a hydrophobic, oleophilic to a hydrophilic state—rather than ablation mechanisms to facilitate imaging of a lithographic plate, which eliminates the need for high imaging power and debris removal. In a first aspect, the invention involves a lithographic printing member comprising a topmost “imaging” layer that undergoes, in response to heat, a transition from a hydrophobic and oleophilic state to a hydrophilic state (which may or may not also be oleophilic); and a substrate disposed below the imaging layer. In general, the affinity change in the imaging layer is essentially due to a foaming agent therein. The foaming agent decomposes upon heating, creating a gas that foams the surface of the imaging layer. The resulting sponge-like texture enables the surface to retain water, i.e., renders it hydrophilic.

In various embodiments, the imaging layer comprises a polymer blend based on polyvinyl alcohol (PVOH), an oleophilic decomposable polymer crosslinker such as hexamethoxymethylmelamine, and a material that absorbs the imaging radiation, which typically (although not necessarily) falls in the infrared (IR) portion of the electromagnetic spectrum. The imaging layer may further contain a surfactant which enhances the oleophilicity of the unimaged areas. Further additives including polymers, crosslinkers, surfactants, catalysts, and/or waxes may be contained in the imaging layer to improve properties such as wear resistance and printing quality.

In various embodiments, the substrate comprises or consists essentially of an electrochemically grained, anodized metal, such as aluminum, which interfaces with the imaging layer through a thin anodic metal oxide layer. Alternatively, the substrate may comprise a polymer or paper.

In another aspect, the invention involves a method of imaging the lithographic printing members described above. In one embodiment, the printing member is exposed to imaging radiation in an imagewise pattern, which causes the imaging layer in areas exposed to the radiation to undergo a transition from a hydrophobic state to a hydrophilic state. Thereby, an imagewise lithographic pattern is created on the printing member, which can then immediately be used for printing.

It should be stressed that, as used herein, the term “member” refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term “hydrophilic” is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these ink-rejecting liquids relative to oil-based materials.

BRIEF DESCRIPTION OF THE DRAWINGS

The foregoing discussion will be understood more readily from the following detailed description of the invention when taken in conjunction with the accompanying drawings, in which.

DESCRIPTION

1. Imaging Apparatus

Figure 1:
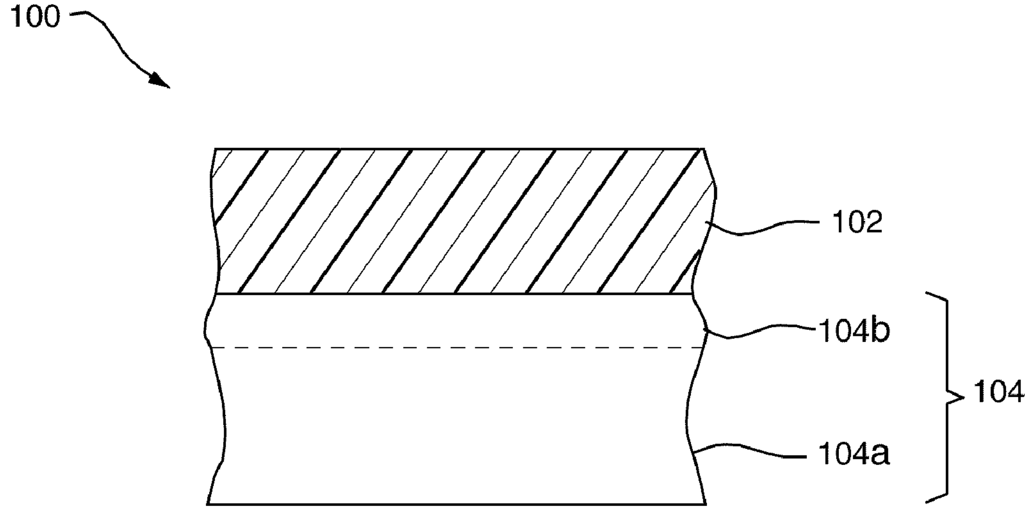
FIG. 1 is an enlarged sectional view of an embodiment of a printing member according to the invention that contains an imaging layer and a substrate.

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the infrared (IR) or near-IR region are fully described in U.S. Pat. Nos. Re. 35,512 ("the '512 patent") and 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, in an array-type system for on-press applications it is generally preferable to employ a plurality of lasers and guide their outputs to a single writing array. The writing array is then shifted, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members with Affinity-Changing Imaging Layers

FIG. 1 illustrates an embodiment 100 of a printing member according to the invention, which includes an imaging layer 102 that undergoes an affinity transition in response to heat, and a substrate 104 disposed thereunder. The substrate 104 may comprise or consist essentially of a metal layer 104*a* and a thin metal oxide layer 104*b* at the interface with the imaging layer 102. The structural integrity of layers 102, 104 is maintained during the imaging process: the imaging layer 102 does not undergo explosive ablation, and no loose particulate debris is released. Further, no detachment of the imaging layer 102 from the substrate 104 or within the imaging layer 102 occurs.

The composition and function of the imaging layer 102 and substrate 104 will now be described in detail.

2.1. Imaging Layer 102

In various embodiments of the invention, the affinity change that the imaging layer 102 undergoes is caused by a foaming agent which, upon exposure to imaging radiation, releases gas that creates a hydrophilic texture at least at the surface of the imaging layer 102. The foaming agent may, for example, be a hydrophobic/oleophilic compound which, upon exposure to heat, (i) decomposes so as to decrease its contribution to the hydrophobicity of the layer and (ii) releases gas to create a porous surface texture capable of retaining water. In other words, in such cases, the foaming agent increases hydrophilicity by chemical and physical mechanisms. One compound exhibiting the chemical and physical characteristics (i) and (ii) is a hexamethoxymethylmelamine crosslinking agent, e.g., CYMEL, available from Cytec Corporation, Wayne, N.J. It should be stressed, however, that other polymeric amino crosslinkers can be used to advantage. CYMEL crosslinker decomposes at temperatures above 350° C., and generates a nitrogenous gas.

It should be understood that the physical, texturing mechanism (ii) is of primary importance, and materials that cause foaming but do not undergo a chemical change that reduces hydrophobicity are within the scope of the present invention, so long as prior to imaging they do not defeat the hydrophobicity of imaging layer 102 and, following imaging, they do not defeat its hydrophilicity. In some embodiments, the concentration of the foaming agent gradually decreases throughout the imaging layer from the top surface to the interface with the substrate. Such a gradient is advantageous in that texturing is confined largely to the surface and therefore does not disrupt bonding between layers 102, 104.

Figure 2:
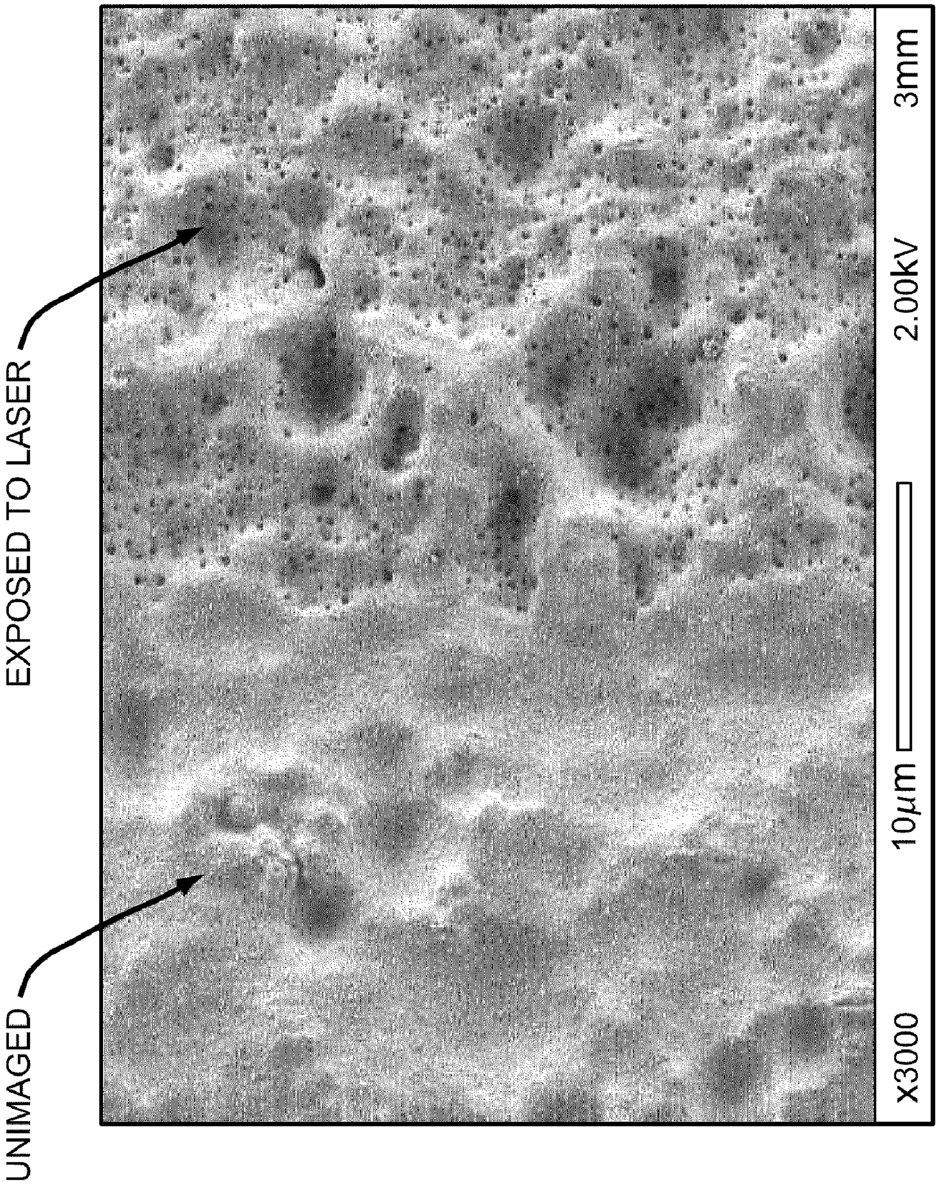
FIG. 2 is an enlarged scanning electron microscopy (SEM) top view image of a printing member according to the invention that illustrates the texture of imaged and unimaged areas.

In the scanning electron microscopy images of FIG. 2, the surface textures of an unimaged area 200 and an imaged area 202 of a printing member according to the invention are directly compared. The foaming agent is embedded in a hard, solid polymer blend, which, taken as a whole and together with the foaming agent, presents a hydrophobic and oleophilic lithographic affinity before exposure to imaging radiation. In some embodiments, polyvinyl alcohol (PVOH) is used as a polymer binder for the blend and constitutes the backbone of layer 102. Layer 102 may contain suitable additives, e.g., to prevent the layer from becoming not only porous and hydrophilic upon exposure to heat, but also at least partially soluble in water and other aqueous fluids, including fountain solution—thereby severely compromising plate integrity during printing. One suitable additive is a core-shell polymer such as NEOCRYL, preferably NEOCRYL A-1131 (supplied by DSM NeoResins, Waalwijk, The Netherlands), which is dispersed in the PVOH matrix. Accordingly, in preferred embodiments, the imaging layer comprises a PVOH-NEOCRYL polymer composite.

It has been found that in a PVOH-based imaging layer with CYMEL as a foaming agent, it is useful to include a highly water-soluble surfactant, i.e., a surfactant with a high HLB (hydrophile-lipophile balance) value. Somewhat surprisingly, the hydrophilic surfactant—which normally serves as a wetting agent due to its water-dispersibility—ensures proper oleophilic behavior of the imaging layer 102 where it is not exposed to imaging radiation.

The mechanical robustness and durability of the imaging layer 102 and its ability to maintain high ink/water differentials can be enhanced with other suitable additives, including crosslinkers, catalysts, surfactants, and/or waxes. For example, the cross-linking agent glyoxal further decreases the vulnerability of PVOH to damage by exposure to fountain solution; however, at excessive concentrations it can cause toning, i.e., failure to prevent ink adhesion to the non-printing (hydrophilic) areas of the plate. Exposure of a printing member to high temperature and/or humidity (resulting, for example, from shipping and storing) can cause blinding, i.e., failure of ink adhesion to the printing (oleophilic) areas. The addition of waxes to the polymer blend may decrease the severity of such damage, but waxes can also soften the imaging layer and reduce the press life of the plate. Accordingly, waxes are generally utilized at low weight percentages. Polymer particle additives such as NEOCRYL prevent blinding while also increasing scratch resistance and press life.

In order to facilitate heating of the imaging layer by exposure to IR or near-IR imaging radiation, suitable IR-absorbing materials can be dispersed in the imaging layer. In preferred embodiments, carbon black (e.g., CAB-O-JET 200 carbon black) is dispersed within the polymer blend before it is cured into layer 102. Alternatively or additionally, a wide range of dyes and pigments, including nigrosine-based dyes, phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.), naphthalocyanines, squarylium dyes, polymethine dyes, iron chelates, nickel chelates, oxoindolizines, iminium salts, or indophenols can be used. In certain embodiments, mixtures of carbon black and IR dye, or mixtures of two or more IR-dyes are used. Any of these materials may be dispersed in a prepolymer before cross-linking into a final film. Alternatively, the absorber may be a chromophore chemically integral with the polymer backbone; see, e.g., U.S. Pat. No. 5,310,869.

The absorption of IR radiation by the dispersed pigments, dyes, or chromophores heats the entire imaging layer 102. However, the temperature decreases towards the interface with the substrate as a result of attenuation of the incoming light and, in the case of a thermally conductive substrate, contact with said substrate 104, which acts as a heat sink.

An exemplary imaging layer 102 may be prepared by mixing and coating methods known in the art, for example, combining a binder polymer, an IR-absorbing material, the hexamethoxymethylmelamine crosslinking and foaming agent, and other additives in a suitable solvent, followed by the addition of a suitable crosslinking catalyst to form the finished coating mix. The imaging layer mix is then applied to the substrate layer 104 (prepared as detailed below) using one of the conventional methods of coating application, such as wire-wound rod coating, reverse roll coating, gravure coating, or slot die coating. The thickness of the imaging layer is typically in the range of from about 0.1 to about 20 microns and more preferably in the range of from about 0.5 to about 1.5 microns. After coating, the layer is dried and preferably cured at a temperature of between 145° C. and 165° C. to remove the volatile liquids and to form a contiguous coating layer.

2.2 Substrate 104

The substrate 104 provides dimensionally stable mechanical support to the printing member and may dissipate heat accumulated in the imaging layer. In preferred embodiments, the substrate is made of aluminum that has been mechanically, chemically, and/or electrically grained, and subsequently anodized. Electrograining involves immersion of two opposed aluminum plates (or one plate and a suitable counterelectrode) in an electrolytic cell and passing alternating current between them. The result of this process is a finely pitted surface topography. A structured or grained surface can also be produced by controlled oxidation, a process commonly called "anodizing." An anodized aluminum substrate consists of an unmodified base layer 104*a* and a porous, "anodic" aluminum oxide coating 104*b* thereover. Further silicate treatment causes the anodized surface to assume the properties of a molecular sieve with a high affinity for molecules of a definite size and shape, which promotes adhesion to the overlying layer 102. The intimate contact between the imaging layer and the thermally conductive aluminum oxide layer 104*b* facilitates the heat conduction to the aluminum base, which acts as a heat sink.

Other suitable metallic substrate materials include, but are not limited to, alloys of aluminum, chromium, and steel, which may have another metal such as copper plated over one surface. Alternatively, substrate 104 may be paper or a polymer film (e.g., polyesters such as polyethylene terephthalate and polyethylene naphthalate, polycarbonates, polyurethane, acrylic, polyamide, or phenolic polymers). Preferred thicknesses for such films range from 0.003 to 0.02 inch, with thicknesses in the range of 0.005 to 0.015 inch being particularly preferred. Paper substrates are typically saturated with a polymeric treatment to improve dimensional stability, water resistance, and strength during the wet lithographic printing. When using a polyester substrate, it may prove desirable to interpose a primer coating between the imaging layer 102 and the substrate 103; suitable formulations and application techniques for such coatings are disclosed, for example, in U.S. Pat. No. 5,339,737, the entire disclosure of which is hereby incorporated by reference.

3. Imaging Techniques

Figure 3:
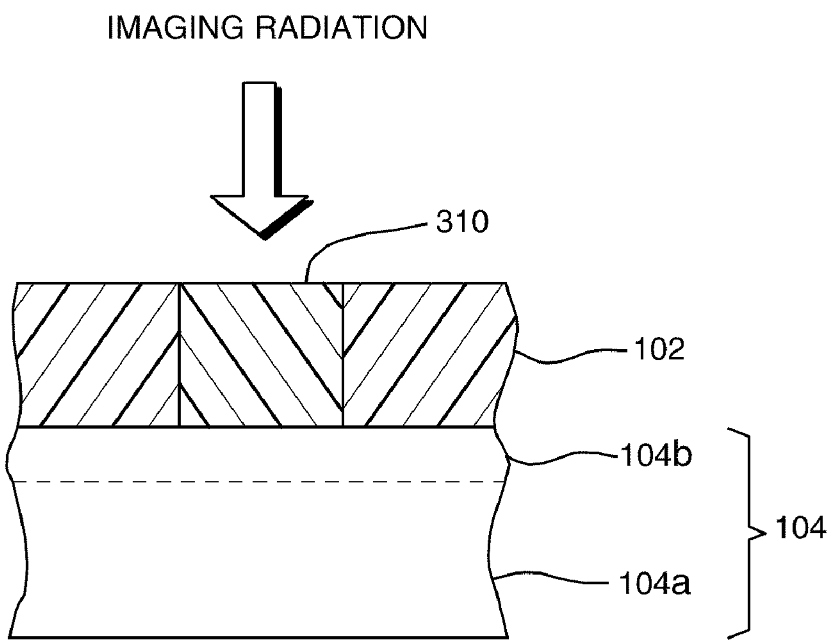
FIG. 3 is an enlarged sectional view of the printing member of FIG. 1 illustrating an imaging mechanism according to the invention.

FIG. 3 illustrates the consequences of imaging the printing member 100, which causes substantially all of the second layer 102 exposed to the imaging radiation to change phase. In preferred embodiments, the printing member 100 is imaged using IR laser radiation at wavelengths of 800-850 nm, 915 nm, or 1064 nm. The imaging layer 102 contains a material that absorbs imaging radiation. Therefore, the exposed area 310 of the imaging layer 102 absorbs the imaging pulse and converts the energy to heat. The heat causes the foaming agent contained in the imaging layer to decompose and to form gases, which foam the surface of layer 102, rendering it porous and hydrophilic. Due to foaming, the surface may become partially soluble. Loose material can be washed off with water by hand or in typical plate-processing equipment at ambient or elevated temperatures. Alternatively, the printing member can be washed on-press with fountain solution without causing color contamination of the inks used in multi-color printing. No gumming or chemical treatment is needed.

In embodiments of the invention, the imaging pulse delivers sufficient energy to the printing member to cause the desired transition(s). The amount of energy required is a function of parameters such as the duration of the pulse, the imaged area, the intrinsic absorption of the imaging layer (as determined, for example, by the concentration of absorber therein), the thickness of the imaging layer, and the presence of a heat sink underneath the imaging layer. Such parameters are easily determined by those skilled in the art without undue experimentation; typical pulse energies per unit area suitable for imaging of preferred printing members as described above range from 100 mJ/cm$^2$ to 500 mJ/cm$^2$.

4. Examples

Example 1

An imaging layer formulation was prepared by dissolving or dispersing 24.5 g Kuraray R-1130 (i.e., silanol-modified polyvinyl alcohol (PVOH) from Kuraray America, Houston, Tex.; 5% in water), 43.0 g CELVOL 325 (i.e., fully hydrolyzed PVOH from Celanese Corporation, Dallas, Tex.; 5% in water), 0.50 g BYK 348 (i.e., polyether-modified siloxane surfactant from BYK-CHEMIE, Wallingford, Conn.; 10% in water), 1.2 g TRITON X-100 (i.e., octylphenol ethylene oxide condensate surfactant from Sigma-Aldrich Chemical, St. Louis, Mo.; 10% in water), 2.5 g BONJET CW-1 (i.e., ultrafine carbon black aqueous dispersion from Orient Chemical, Osaka, Japan), 0.20 g CYMEL 303 LF (i.e., methylated melamine formaldehyde resin from Cytec Industries, West Paterson, N.J.), 0.05 g CYMEL 385 (i.e., melamine-formaldehyde resin from Cytec Industries, West Paterson, N.J.), 1.4 g NACURE 2530 (i.e., 25% (blocked) para-toluene sulfonic acid (p-TSA) in methanol/isopropanol, from King Industries, Norwalk, Conn.), 1.6 g NEOCRYL A-1131 (i.e., anionic modified acrylic copolymer dispersion from DSM NeoResins, Waalwijk, Netherlands), and 0.60 g Glyoxal TD (i.e., glycoxal trimer dehydrate from Sigma-Aldrich, St. Louis, Mo.; 20% in water) in 19.8 g of water and 4.9 g of isopropyl alcohol (IPOH). This formulation was applied to an electrochemically grained and sulfuric-acid-anodized aluminum substrate to provide a coating weight of about 1.0 μm, and dried for approximately 50 seconds in a Wisconsin Conveyor oven at between 196° C. and 200° C.

The resulting imageable element was placed on a Presstek DIMENSION 425, and imaged with a 915-nm IR laser array at a nominal power setting of 1000 mA and a pulse width of between 1.2 μs and 2.0 μs, corresponding to an intensity of between 350 mJ/cm$^2$ and 600 mJ/cm$^2$. The imaged element was then mounted onto a Sakurai Oliver 272eII press charged with Crystal 2500 Fountain Solution and VARN Jet Wet, each at 3 oz per gallon of water, and Spinks Ink Titan Printing Ink Process black and magenta. Fountain Solution was added for ten cycles, and the ink was added with the first sheet of paper. The fresh imaged element rolled up and maintained consistent density within 20 impressions. Print runs of up to 100,000 impressions did not result in significant wear.

Multiple other imaged elements were placed on a Heidelberg GTO press charged with CRYSTAL 2500 Fountain Solution at 3 oz per gallon of water and Titan Process Yellow Ink. The imaged element was wet with fountain solution for ten impressions, the ink was added with the first sheet, and 200 impressions were run for each element. No contamination of the ink occurred, as evidenced by constant Delta E of the printed sheets (i.e., constant distance between colors of the white, un-inked and the inked sheets).

Example 2

An imaging layer formulation was prepared by dissolving or dispersing 24.5 g Kuraray R-1130 (5% in water), 43.0 g CELVOL 325 (5% in water), 0.50 g BYK 348 (10% in water), 1.2 g TRITON X-100 (10% in water), 16.3 g of IR Dye SDB-4927 (from H.W. Sands Corporation, Jupiter, Fla.; 3% in a 3:1 water/IPOH blend), 0.20 g CYMEL 303 LF, 0.05 g CYMEL 385, 1.4 g NACURE 2530, 1.6 g NEOCRYL A-1131, and 0.60 g Glyoxal TD (20% in water) in 6.0 g of water and 4.9 g of IPOH. This formulation was applied to an electrochemically grained and sulfuric-acid-anodized aluminum substrate to provide a coating weight of about 1.0 μm, and dried for approximately 50 seconds in a Wisconsin Conveyor oven at between 196° C. and 200° C.

The resulting imageable element was placed on a Presstek DIMENSION 425, and imaged with a 915-nm IR laser array at a nominal power setting of 1000 mA and a pulse width of 1.2 μs, corresponding to approximately 350 mJ/cm$^2$. The imaged element was then mounted onto a Heidelberg GTO press charged with Crystal 2500 Fountain Solution at 3 oz per gallon of water, VARN Jet Wet at 1 oz per gallon of water, and Titan Process Black ink. The imaged element was wet with fountain solution for 10 impressions, and the ink was added with the first sheet. Good ink density and print quality were obtained in less than 10 impressions. Another 500 impressions were printed, and showed strong images of both solids and highlights.

Example 3

An imaging layer formulation was prepared by dissolving or dispersing 24.5 g Kuraray R-1130 (5% in water), 43.0 g CELVOL 325 (5% in water), 0.50 g BYK 348 (10% in water), 1.2 g TRITON X-100 (10% in water), 16.3 g IR Dye SDB-4927 (3% in a 3:1 water/IPOH blend), 1.23 g BONJET CW-1, 0.20 g CYMEL 303 LF, 0.05 g CYMEL 385, 1.4 g NACURE 2530, 1.6 g NEOCRYL A-1131, and 0.60 g Glyoxal TD (20% in water) in 4.8 g of water and 4.9 g of IPOH. This formulation was applied to an electrochemically grained and sulfuric-acid-anodized aluminum substrate to provide a coating weight of about 1.0 μm, and dried for approximately 50 seconds in a Wisconsin Conveyor oven at between 196° C. and 200° C.

The resulting imageable element was placed on a Presstek DIMENSION 425, and imaged with a 915-nm IR laser array at a nominal power setting of 1000 mA and a pulse width of 1.2 μs, corresponding to approximately 350 mJ/cm$^2$. The imaged element was then mounted onto a Heidelberg GTO press charged with Crystal 2500 Fountain Solution at 3 oz gallon of water, VARN Jet Wet at 1 oz per gallon of water, and Titan Process Black ink. The imaged element was wet with fountain solution for 10 impressions, and the ink was added with the first sheet. Good ink density and print quality were obtained in less than 10 impressions. Another 500 impressions were printed, and showed strong images of both solids and highlights.

Example 4

An imageable layer formulation was prepared by dissolving or dispersing 24.5 g Kuraray R-1130 (5% in water), 43.0 g CELVOL 325 (5% in water), 0.50 g BYK 348 (10% in water), 1.2 g TRITON X-100 (10% in water), 21.7 g IR Dye SDB-4927 (4.5% in a 3:1 water/IPOH blend), 0.20 g CYMEL 303 LF, 0.05 g CYMEL 385, 1.4 g NACURE 2530, 1.6 g NEOCRYL A-1131, and 0.60 g Glyoxal TD (20% in water) in 1.75 g of water and 3.5 g of IPOH. This formulation was applied to an electrochemically grained and sulfuric-acid-anodized aluminum substrate to provide a coating weight of about 1.0 μm, and dried for approximately 50 seconds in a Wisconsin Conveyor oven at between 196° C. and 200° C.

The resulting imageable element was placed on a KODAK Trendsetter® 3244, and imaged with an 83-nm IR laser at 160 rpm and 21 W, corresponding to approximately 309 mJ/cm$^2$. The imaged element was then mounted onto a Heidelberg GTO press charged with Crystal 2500 Fountain Solution at 3 oz per gallon of water, VARN Jet Wet at 1 oz per gallon of water, and Titan Process Black ink. The imaged element was wet with fountain solution for ten impressions, and the ink was added with the first sheet. Good ink density and print quality were obtained in less than 10 impressions. Another 400 impressions were printed, and showed strong images of both solids and highlights.

Example 5

An imaging layer formulation was prepared by dissolving or dispersing 24.5 g Kuraray R-1130 (5% in water), 43.0 g CELVOL 325 (5% in water), 0.50 g BYK 348 (10% in water), 1.2 g TRITON X-100 (10% in Water), 16.3 g of IR Dye SDA-9632 (from H.W. Sands Corporation, Jupiter, Fla.; 3% in a 3:1 water/IPOH blend), 1.23 g BONJET CW-1, 0.20 g CYMEL 303 LF, 0.05 g CYMEL 385, 1.4 g NACURE 2530, 1.6 g NEOCRYL A-1131, and 0.60 g Glyoxal TD (20% in water) in 4.8 g of water and 4.9 g of IPOH. This formulation was applied to an electrochemically grained and sulfuric-acid-anodized aluminum substrate to provide a coating weight of about 1.0 μm, and dried for approximately 50 seconds in a Wisconsin Conveyor oven at between 196° C. and 200° C.

The resulting imageable element was placed on a Presstek DIMENSION 425, and imaged with a 915-nm IR laser array at a nominal power setting of 1000 mA and a pulse width of 1.2 μs, corresponding to approximately 350 mJ/cm$^2$. The imaged element was then mounted onto a Heidelberg GTO press charged with Crystal 2500 Fountain Solution at 3 oz per gallon of water, VARN Jet Wet at 1 oz per gallon of water, and Titan Process Black ink. The imaged element was wet with fountain solution for ten impressions, and the ink was added with the first sheet. Good ink density and print quality were obtained in less than 10 impressions. Another 500 impressions were printed, and showed strong images of both solids and highlights.

It will be seen that the foregoing techniques provide a basis for improved lithographic printing and superior plate constructions. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A lithographic printing member comprising:

(a) a hydrophobic imaging layer comprising a heat-activated foaming agent, the imaging layer being foamable into a hydrophilic state; and (b) a substrate disposed below the imaging layer.

2. The member of claim 1 wherein the foaming agent is oleophilic.

3. The member of claim 1 wherein the foaming agent comprises or consists essentially of hexamethoxymethylmelamine.

4. The member of claim 1 wherein the imaging layer comprises a polymer blend.

5. The member of claim 4 wherein the polymer blend comprises a polyvinyl alcohol binder.

6. The member of claim 4 wherein the imaging layer further comprises at least one additive selected from the group consisting of polymers, crosslinkers, surfactants, catalysts, and waxes.

7. The member of claim 6 wherein the imaging layer comprises glyoxal.

8. The member of claim 6 wherein the imaging layer comprises a core-shell polymer.

9. The member of claim 1 wherein the imaging layer further comprises a material that absorbs IR or near-IR radiation.

10. The member of claim 9 wherein the IR-absorbing material comprises or consists essentially of a pigment.

11. The member of claim 10 wherein the pigment is carbon black.

12. The member of claim 9 wherein the IR-absorbing material comprises or consists essentially of a dye.

13. The member of claim 12 wherein the dye is at least one of a cyanine dye, a squarylium dye, or a polymethine dye.

14. The member of claim 1 wherein the concentration of the foaming agent decreases throughout the imaging layer from the top surface to the interface with the substrate.

15. The member of claim 1 wherein the substrate comprises or consists essentially of aluminum.

16. A method of imaging a lithographic printing member, the method comprising the steps of:

(a) providing a printing member comprising a hydrophobic imaging layer containing a heat-activated foaming agent, and a substrate disposed below the imaging layer and (b) exposing the priming member to imaging radiation in an imagewise pattern so as to cause the foaming agent in the exposed areas to decompose and thereby selectively texture the imaging layer into a hydrophilic state, thereby creating an imagewise lithographic pattern on the printing member.

17. The method of claim 16 wherein the imaging radiation is IR or near-IR laser radiation and the imaging layer comprises a material that absorbs IR or near-IR radiation.

18. The member of claim 17 wherein the IR-absorbing material comprises or consists essentially of a pigment.

19. The member of claim 18 wherein IR-absorbing, material is carbon black.

20. The member of claim 17 wherein the IR-absorbing material comprises or consists essentially of a dye.

21. The member of claim 20 wherein the dye is at least one of a cyanine dye, a squarylium dye, or a polymethine dye.

22. The method of claim 16 wherein the foaming agent is oleophilic.

23. The method of claim 16 wherein the foaming agent comprises or consists essentially of hexamethoxymethylmelamine.

24. The method of claim 16 wherein the imaging layer comprises a polymer blend.

25. The method of claim 24 wherein the polymer blend is a polyvinyl alcohol.

26. The method of claim 24 wherein the imaging layer further comprises at least one additive selected from the group consisting of polymers, crosslinkers, surfactants, catalysts, and waxes.

* * * * *